United States Patent
Bunyan et al.

(10) Patent No.: US 6,248,393 B1
(45) Date of Patent: Jun. 19, 2001

(54) FLAME RETARDANT EMI SHIELDING MATERIALS AND METHOD OF MANUFACTURE

(75) Inventors: Michael H. Bunyan, Chelmsford, MA (US); William I. Flanders, Merimack, NH (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 09/250,338

(22) Filed: Feb. 16, 1999

Related U.S. Application Data
(60) Provisional application No. 60/076,370, filed on Feb. 27, 1998.

(51) Int. Cl.$^7$ ...................................................... B05D 5/12
(52) U.S. Cl. ........................ 427/77; 427/385.5; 427/389.9
(58) Field of Search ................................. 427/77, 385.5, 427/389.9

(56) References Cited

U.S. PATENT DOCUMENTS

| | | |
|---|---|---|
| 4,178,410 | 12/1979 | Tomita . |
| 4,396,661 | 8/1983 | George et al. . |
| 4,447,484 | 5/1984 | Slosberg et al. . |
| 4,489,126 | 12/1984 | Holtrop et al. . |
| 4,531,994 | 7/1985 | Holtrop et al. . |
| 4,540,617 | 9/1985 | Kawanishi et al. . |
| 4,569,304 | 2/1986 | Le Maitre . |
| 4,572,960 | 2/1986 | Ebneth et al. . |
| 4,608,104 | 8/1986 | Holtrop et al. . |
| 4,621,013 | 11/1986 | Holtrop et al. . |
| 4,666,765 | 5/1987 | Caldwell et al. . |
| 4,684,762 | 8/1987 | Gladfeiter . |
| 4,753,750 | 6/1988 | Van Gompel . |
| 4,797,171 | 1/1989 | Van Gompel . |
| 4,857,668 | 8/1989 | Buonanno . |
| 4,871,477 | 10/1989 | Dimanshteyn . |
| 4,988,550 | 1/1991 | Keyser et al. . |
| 5,009,927 | 4/1991 | Cloyd et al. . |
| 5,028,739 | 7/1991 | Keyser et al. . |
| 5,045,635 | 9/1991 | Kaplo et al. . |

(List continued on next page.)

FOREIGN PATENT DOCUMENTS

| | | |
|---|---|---|
| 9013936 | 12/1990 | (DE) . |
| 0326441 | 8/1989 | (EP) . |
| 2308030 | 11/1976 | (FR) . |
| 7-176889 | * 7/1995 | (JP) . |

OTHER PUBLICATIONS

Kleiner, J. Vinyl Technol. vol. 4 No. 4, Dec. 1982, pp 157–159.*
Copy of International Serch Report for PCT Case No. PCT/US99/04100, Jan. 7, 1999.
Chomerics Parker Hannifin Seals Catalog dated 1997 for Soft–Shield Low Closure Force EMI Gaskets.
Monsanto Flectron Metalized Materials dated Sep. 12, 1995.

*Primary Examiner*—Erma Cameron
(74) *Attorney, Agent, or Firm*—John A. Molnar, Jr.

(57) ABSTRACT

An flame retardant, electrically-conductive EMI shielding material and method, the material being particularly adapted for use in fabric-over-foam EMI shielding gasket constructions. In construction, a generally planar, porous fabric member is provided as having at least an electrically-conductive first side and a second side defining a thickness dimension therebetween. A curable layer of a fluent, flame retardant composition is applied under a predetermined hydrodynamic pressure and viscosity to at least a portion of the second side of the fabric member. The hydrodynamic pressure and viscosity of the composition are controlled to delimit the penetration of the layer into the fabric member to a depth which is less than the thickness dimension of said fabric member. The layer then is cured to form a flame retardant surface coating on the second side of the fabric member such that the first side of said fabric member remains electrically-conductive.

9 Claims, 3 Drawing Sheets

U.S. PATENT DOCUMENTS

| | | |
|---|---|---|
| 5,089,325 | 2/1992 | Covey . |
| 5,105,056 | 4/1992 | Hoge, Jr. et al. . |
| 5,122,411 | 6/1992 | Iwamoto et al. . |
| 5,202,536 | 4/1993 | Buonanno . |
| 5,204,403 | 4/1993 | Furuta et al. . |
| 5,226,354 | 7/1993 | Tohyama et al. . |
| 5,612,092 | 3/1997 | Strenger et al. . |
| 5,614,306 | 3/1997 | Jobe et al. . |
| 5,635,252 | 6/1997 | Fraser, Jr. et al. . |
| 5,641,544 | 6/1997 | Melancon et al. . |
| 5,647,606 | 7/1997 | Powers, Jr. . |
| 5,700,532 | 12/1997 | Chiou . |

* cited by examiner

FLAME RETARDANT EMI SHIELDING MATERIALS AND METHOD OF MANUFACTURE

RELATED CASES

The present application claims priority to U.S. Provisional application Ser. No. 60/076,370; filed Feb. 27, 1998.

BACKGROUND OF THE INVENTION

The present invention relates broadly to electrically-conductive, flame retardant materials for use in electromagnetic interference (EMI) shielding, and to a method of manufacturing the same, and more particularly to an electrically-conductive fabric having a layer of a flame retardant coating applied to one surface thereof for use as a sheathing within an EMI shielding gasket.

The operation of electronic devices including televisions, radios, computers, medical instruments, business machines, communications equipment, and the like is attended by the generation of electromagnetic radiation within the electronic circuitry of the equipment. Such radiation often develops as a field or as transients within the radio frequency band of the electromagnetic spectrum, i.e., between about 10 KHz and 10 GHz, and is termed "electromagnetic interference" or "EMI" as being known to interfere with the operation of other proximate electronic devices.

To attenuate EMI effects, shielding having the capability of absorbing and/or reflecting EMI energy may be employed both to confine the EMI energy within a source device, and to insulate that device or other "target" devices from other source devices. Such shielding is provided as a barrier which is inserted between the source and the other devices, and typically is configured as an electrically conductive and grounded housing which encloses the device. As the circuitry of the device generally must remain accessible for servicing or the like, most housings are provided with openable or removable accesses such as doors, hatches, panels, or covers. Between even the flattest of these accesses and its corresponding mating or faying surface, however, there may be present gaps which reduce the efficiency of the shielding by presenting openings through which radiant energy may leak or otherwise pass into or out of the device. Moreover, such gaps represent discontinuities in the surface and ground conductivity of the housing or other shielding, and may even generate a secondary source of EMI radiation by functioning as a form of slot antenna. In this regard, bulk or surface currents induced within the housing develop voltage gradients across any interface gaps in the shielding, which gaps thereby function as antennas which radiate EMI noise. In general, the amplitude of the noise is proportional to the gap length, with the width of the gap having a less appreciable effect.

For filling gaps within mating surfaces of housings and other EMI shielding structures, gaskets and other seals have been proposed both for maintaining electrical continuity across the structure, and for excluding from the interior of the device such contaminates as moisture and dust. Such seals are bonded or mechanically attached to, or press-fit into, one of the mating surfaces, and function to close any interface gaps to establish a continuous conductive path thereacross by conforming under an applied pressure to irregularities between the surfaces. Accordingly, seals intended for EMI shielding applications are specified to be of a construction which not only provides electrical surface conductivity even while under compression, but which also has a resiliency allowing the seals to conform to the size of the gap. The seals additionally must be wear resistant, economical to manufacture, and capability of withstanding repeated compression and relaxation cycles. For further information on specifications for EMI shielding gaskets, reference may be had to Severinsen, J., "Gaskets That Block EMI," Machine Design, Vol. 47, No. 19, pp. 74–77 (Aug. 7, 1975).

Requirements for typical EMI shielding applications often dictate a low impedance, low profile gasket which is deflectable under normal closure force loads. Other requirements include low cost and a design which provides an EMI shielding effectiveness for both the proper operation of the device and compliance, in the United States, with commercial Federal Communication Commission (FCC) EMC regulations.

A particularly economical gasket construction, which also requires very low closure forces, i.e. less than about 1 lb/inch (0.175 N/mm), is marketed by the Chomerics Division of Parker-Hannifin Corp., Woburn, Mass. under the tradename "Soft-Shield® 5000 Series." Such construction consists of an electrically-conductive jacket or sheathing which is "cigarette" wrapped lengthwise over a polyurethane or other foam core. As is described further in U.S. Pat. No. 4,871,477, polyurethane foams generally are produced by the reaction of polyisocyanate and a hydroxyl-functional polyol in the presence of a blowing agent. The blowing agent effects the expansion of the polymer structure into a multiplicity of open or closed cells.

The jacket is provided as a highly conductive, i.e., about 1 $\Omega$-sq., nickel-plated-silver, woven rip-stop nylon which is self-terminating when cut. Advantageously, the jacket may be bonded to the core in a continuous molding process wherein the foam is blown or expanded within the jacket as the jacket is wrapped around the expanding foam and the foam and jacket are passed through a die and into a traveling molding. Similar gasket constructions are shown in commonly-assigned U.S. Pat. No. 5,028,739 and in U.S. Pat. Nos. 4,857,668; 5,054,635; 5,105,056; and 5,202,536.

Many electronic devices, including PC's and communication equipment, must not only comply with certain FCC requirements, but also must meet be approved under certain Underwriter's Laboratories (UL) standards for flame retardancy. In this regard, if each of the individual components within an electronic device is UL approved, then the device itself does not require separate approval. Ensuring UL approval for each component therefore reduces the cost of compliance for the manufacturer, and ultimately may result in cheaper goods for the consumer. For EMI shielding gaskets, however, such gaskets must be made flame retardant, i.e., achieving a rating of V-0 under UL Std. No. 94, "Tests for Flammability of Plastic Materials for Parts in Devices and Appliances" (1991), without compromising the electrical conductivity necessary for meeting EMI shielding requirements.

In this regard, and particularly with respect to EMI shielding gaskets of the abovedescribed fabric over foam variety, it has long been recognized that foamed polymeric materials are flammable and, in certain circumstances, may present a fire hazard. Owing to their cellular structure, high organic content, and surface area, most foam materials are subject to relatively rapid decomposition upon exposure to fire or high temperatures.

One approach for imparting flame retardancy to fabric over foam gaskets has been to employ the sheathing as a flame resistant protective layer for the foam. Indeed, V-0 rating compliance purportedly has been achieved by sheathing the foam within an electrically-conductive Ni/Cu-plated fabric to which a thermoplastic sheet is hot nipped or otherwise fusion bonding to the underside thereof. Such fabrics, which may be further described in one or more of U.S. Pat. Nos. 4,489,126; 4,531,994; 4,608,104; and/or 4,621,013, have been marketed by Monsanto Co., St. Louis, under the tradename "Flectron® Ni/Cu Polyester Taffeta V0."

Other fabric over foam gaskets, as is detailed in U.S. Pat. No. 4,857,668, incorporate a supplemental layer or coating applied to the interior surface of the sheath. Such coating may be a flame-retardant urethane formulation which also promotes the adhesion of the sheath to the foam. The coating additionally may function to reduce bleeding of the foam through the fabric which otherwise could compromise the electrical conductivity of the sheath.

In view of the foregoing, it will be appreciated that further improvements in the design of flame retardant, fabric-over-foam EMI shielding gaskets, as well as sheathing materials therefore, would be well-received by the electronics industry. Especially desired would be a flame retardant gasket construction which achieves a UL94 rating of V-0.

BROAD STATEMENT OF THE INVENTION

The present invention is directed to an electrically-conductive, flame retardant material for use in fabric-over-foam EMI shielding gaskets, and to a method of manufacturing the same. In having a layer of a flame retardant coating applied to one side of an electrically-conductive, generally porous fabric, the material of the invention affords UL94 V-0 protection when used as a jacketing in a fabric-over-foam gasket construction. Advantageously, as the flame retardant layer may be wet coated on the fabric without appreciable bleed through, a relatively thin, i.e., 2–4 mil (0.05–0.10 mm), coating layer may be provided on one fabric side without compromising the electrical surface conductivity of the other side. Such a thin coating layer, while being sufficient to provide UL94 V-0 protection, nonetheless maintains the drapability the fabric and thereby facilitates the construction UL94 V-0 compliant gaskets having complex profiles or narrow cross-sections down to about 1 mm.

In a preferred embodiment, the electrically-conductive, flame retardant EMI shielding material of the invention includes a nickel or silver-plated, woven nylon, polyester, or like fabric on one side of which is wet coated a layer of a flame retardant, acrylic latex emulsion or other fluent resin composition. In accordance with the precepts of the method of the invention, the viscosity and hydrodynamic pressure of the emulsion are controlled such that the coating does not penetrate or otherwise "bleed through" the uncoated side of the fabric. The surface conductivity of the opposite side of the fabric therefore is not compromised in EMI shielding applications.

The material of the invention may be employed as a jacket in fabric-over-foam EMI shielding gasket constructions, and is particularly adapted for use in the continuous molding process for such gaskets. As used within such process, the fabric may be wrapped around the foam as a jacket with coated side thereof being disposed as an interior surface adjacent the foam, and the uncoated side being disposed as an electrically-conductive exterior surface. Advantageously, the coating on the interior surface of the jacket blocks the pores of the fabric to retain the foam therein without penetrate or bleed through to the exterior surface. In being formed of a acrylic material, the coated interior surface of the jacket may function, moreover, depending upon the composition of the foam, as a compatibilizing or "tie" interlayer which promotes the bonding of the foam to the fabric.

The present invention, accordingly, comprises material and method possessing the construction, combination of elements, and arrangement of parts and steps which are exemplified in the detailed disclosure to follow. Advantages of the present invention include a flame retardant yet drapable EMI shielding fabric. Additional advantages include an economical, flame retardant EMI shielding fabric construction wherein a relatively thin layer of a flame retardant coating may be wet coated onto one side of an electrically-conductive, woven or other generally porous EMI shielding fabric without compromising the conductivity of the other side of the fabric. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein.

Figure 1:
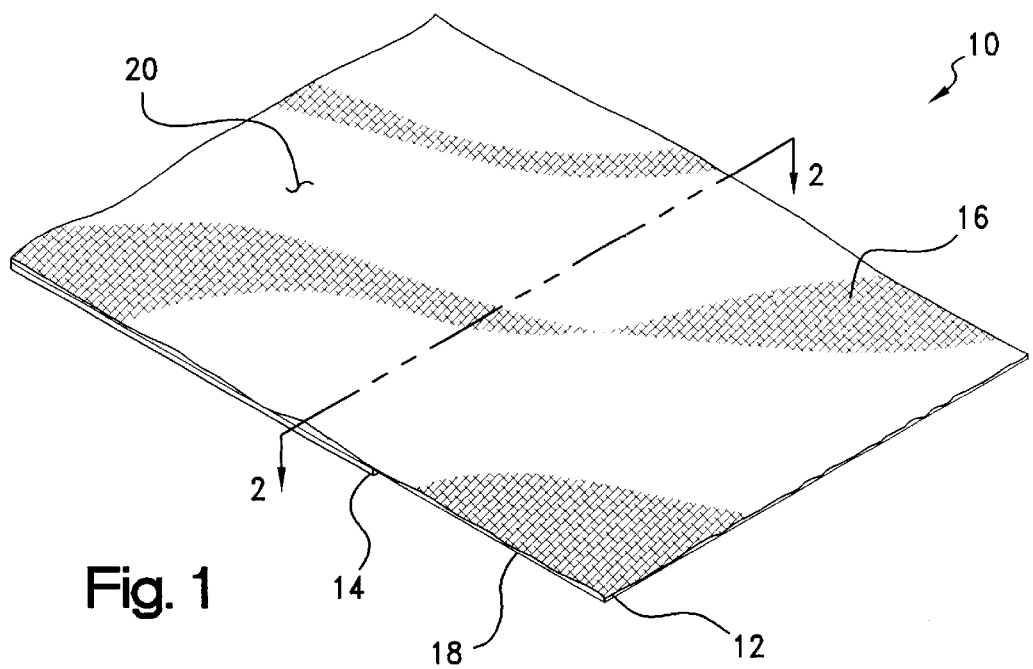
FIG. 1 is a perspective view of one embodiment of an EMI shielding material according to the present invention which material includes a generally planar fabric member on one side of which is coated a layer of a flame retardant composition, the view being shown with portions being broken away to better reveal the structure of the material.

The drawings will be described further in connection with the following Detailed Description of the Invention.

DETAILED DESCRIPTION OF THE INVENTION

Certain terminology may be employed in the description to follow for convenience rather than for any limiting purpose. For example, the terms "upper" and "lower" designate directions in the drawings to which reference is made, with the terms "inner" or "interior" and "outer" or "exterior" referring, respectively, to directions toward and away from the center of the referenced element, and the terms "radial" and "axial" referring, respectively, to directions perpendicular and parallel to the longitudinal central axis of the referenced element. Terminology of similar import other than the words specifically mentioned above likewise is to be considered as being used for purposes of convenience rather than in any limiting sense.

For the illustrative purposes of the discourse to follow, the electromagnetic interference (EMI) shielding material herein involved is described in connection with its use as a flame retardant, electrically-conductive jacket for a foam core, EMI shielding gasket as may be adapted to be received within an interface, such as between a door, panel, hatch, cover, or other parting line of an electromagnetic interference (EMI) shielding structure. The EMI shielding structure may be the conductive housing of a computer, communications equipment, or other electronic device or equipment which generates EMI radiation or is susceptible to the effects thereof. The gasket may be bonded or fastened to, or press-fit into one of a pair of mating surfaces which define the interface within the housing, and functions between the mating surfaces to seal any interface gaps or other irregularities. That is, while under an applied pressure, the gasket resiliently conforms to any such irregularities both to establish a continuous conductive path across the interface, and to environmentally seal the interior of the housing against the ingress of dust, moisture, or other contaminates. It will be appreciated, however, that aspects of the present invention may find utility in other EMI shielding applications. Use within those such other applications therefore should be considered to be expressly within the scope of the present invention.

Referring then to the figures, wherein corresponding reference characters are used to designate corresponding elements throughout the several views, a flame retardant EMI shielding material according to the present invention is shown generally at 10 in FIG. 1 as generally adapted for use as a jacket within for a foam core gasket construction. For purposes of illustration, material sheet 10 is shown to be of indefinite dimensions which may be cut to size for the particular application envisioned. In basic construction, material 10 includes an upper, generally planar and porous fabric member, 12, and a lower, flame retardant coating member, 14.

Figure 2:
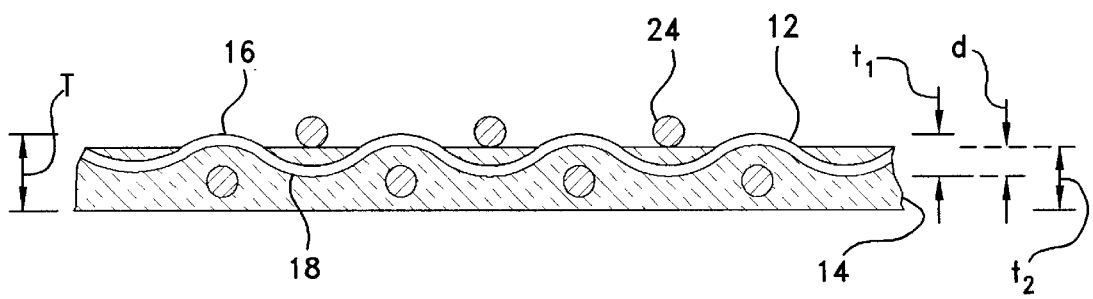
FIG. 2 is an enlarged cross-sectional view of the EMI shielding material of FIG. 1 taken through plane represented by line 2—2 of FIG. 1.

Fabric member has at least an electrically-conductive first side, 16, and a conductive or non-conductive second side, 18, defining a thickness dimension, referenced at "$t_1$" in the cross-sectional view of FIG. 2, which may vary from about 2–4 mils (0.05–0.10 mm). By "electrically-conductive," it is meant that the fabric may be rendered conductive, i.e., to a surface resistivity of about 0.1 Ω/sq. or less, by reason of its being constructed of electrically-conductive wire, monofilaments, yams or other fibers or, alternatively, by reason of a treatment such as a plating or sputtering being applied to non-conductive fibers to provide an electrically-conductive layer thereon. Preferred electrically-conductive fibers include Monel nickel-copper alloy, silver-plated copper, nickel-clad copper, Ferrex® tin-plated copper-clad steel, aluminum, tin-clad copper, phosphor bronze, carbon, graphite, and conductive polymers. Preferred non-conductive fibers include cotton, wool, silk, cellulose, polyester, polyamide, nylon, and polyimide monofilaments or yams which are rendered electrically conductive with a metal plating of copper, nickel, silver, nickel-plated-silver, aluminum, tin, or an alloy thereof. As is known, the metal plating may applied to individual fiber strands or to the surfaces of the fabric after weaving, knitting, or other fabrication.

Figure 3:
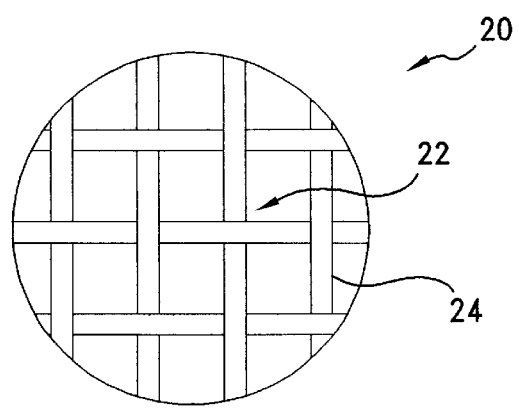
FIG. 3 is a top view of the material of FIG. 1 which is magnified to reveal the structure of the fabric member thereof.

While fabrics such as wire meshes, knits, and non-woven cloths and webs may find application, a preferred fabric construction for member 12 is a plain weave nylon or polyester cloth which is made electrically conductive with between about 20–40% by weight based on the total fabric weight, i.e., 0.01–0.10 g/in$^2$, of a silver, nickel-silver, or silver-nickel over copper plating. As may be seen in the magnified view of FIG. 1 referenced at 20 in FIG. 3, such cloth is permeable in having a plain, generally square weave pattern with pores or openings, one of which is referenced at 22, being defined between the fibers which are represented schematically at 24. Fibers 24 may be yarns, monofilaments or, preferably, bundles of from about 10–20 filaments or threads, each having a diameter of between about 10–50 μm. For example, with fibers 24 each being a bundle of such threads with a thread count of between about 1000–3000 per inch and a weave count of between about 1000–1500 per inch, 1000–2000 openings per inch will be defined with a mean average pore size of between about 0.5–2 mils (12.5–50 μm).

Although a plain, square weave pattern such as a taffeta, tabby, or ripstop is considered preferred, other weaves such as satins, twills, and the like also should be considered within the scope of the invention herein involved. A particularly preferred cloth for fabric member 12 is a 4 mil (0.10 mm) thick, 1.8 oz/yd$^2$ weight, silver-plated, woven nylon which is marketed commercially under the designation "31EN RIPSTOP" by Swift Textile Metalizing Corp., Bloomfield, Conn. However, depending upon the needs of the specific shielding application, a fabric constructed of a combination or blend of conductive and nonconductive fibers alternatively may be employed. Examples of fabrics woven, braided, or warp knitted from electrically-conductive fibers, or from blends of conductive and non-conductive fibers, are described in Gladfelter, U.S. Pat. No. 4,684,762, and in Buonanno, U.S. Pat. No. 4,857,668.

Returning to FIGS. 1 and 2, coating member 14 preferably is formed from a curable layer of a fluent, flame retardant resin or other composition which is wet coated onto the second side 18 of fabric member 12. As is detailed hereinafter, the viscosity and hydrodynamic pressure of the resin composition are controlled in accordance with the precepts of the present invention to delimit the penetration of the resin layer to a depth, referenced at "d" in FIG. 2, which is less than the thickness dimension $t_1$ of the fabric member 12. In this regard, when the layer is cured to form the flame retardant surface coating member 14 on the second side 18 of fabric member 12, the first side 16 thereof remains electrically-conductive. In a preferred construction, the layer is coated to a wet thickness of about 10 mils (0.25 mm), and then cured to a dried coating or film thickness, referenced at $t_2$ in FIG. 2, of between about 2–4 mils (0.05–0.10 mm) at a depth d of about 1–2 mils (0.025–0.05 mm). Ultimately, a total material thickness, referenced at "T," of between about 6–7 mils (0.15–0.20 mm) and a dried weight pickup of between about 100–150 g/yd$^2$ are observed. By "cured" it is meant that the resin is polymerized, cross-linked, further cross-linked or polymerized, vulcanized, hardened, dried, volatilized, or otherwise chemically or physically changed from a liquid or other fluent form into a solid polymeric or elastomeric phase.

The flame retardant composition preferably is formulated as an aqueous emulsion of an acrylic latex emulsion which is adjusted to a total solids of about 60% and a Brookfield viscosity (#5 spindle, 4speed) of between about 40,000–60,000 cps, at a density of about 10 lbs per gallon (1.8 g/cm$^3$). Flame retardancy may be imparted by loading the emulsion with between about 30–50% by weight of one or more conventional flame retardant additives such as aluminum hydrate, antimony trioxide, phosphate esters, or halogenated compounds such as polybrominated diphenyl oxides. A preferred formulation is a mixture of about 25% by weight, based on the total weight of the emulsion, of decambromo-diphenyl oxide and about 15% by weight of one or more antimony compounds. In operation, should the acrylic carrier phase be ignited, the decomposition of the halogenated and metal oxide compounds function to chemically deprive the flame of sufficient oxygen to support combustion. The decomposition of the acrylic phase additionally may lead to the development of a protective, i.e., thermally-insulative or refractory, outer char layer.

A preferred flame retardant, acrylic latex emulsion is marketed commercially by Heveatex Corp., Fall River, Mass., under the designation "4129FR." The viscosity of the emulsion may be adjusted to between about 40,000–60,000 cps using an aqueous acryloid gel or other acrylic thickener. In this regard, the increased viscosity of the emulsion contributes to delimiting the penetration of the coating layer into the fabric member. However, as this relatively high viscosity may lead to undesirable porosity in the dried film, the emulsion additionally may be modified to reduce air entrapment and bubble formation in the coating layer with up to about 1% by weight of one or more commercial surfactants such as "Bubble Breaker" by Witco Chemical Corp. (Chicago, Ill.) and "Foam Master Antifoam" by Diamond Shamrock, Inc. (San Antonio, Tex.).

Figure 4:
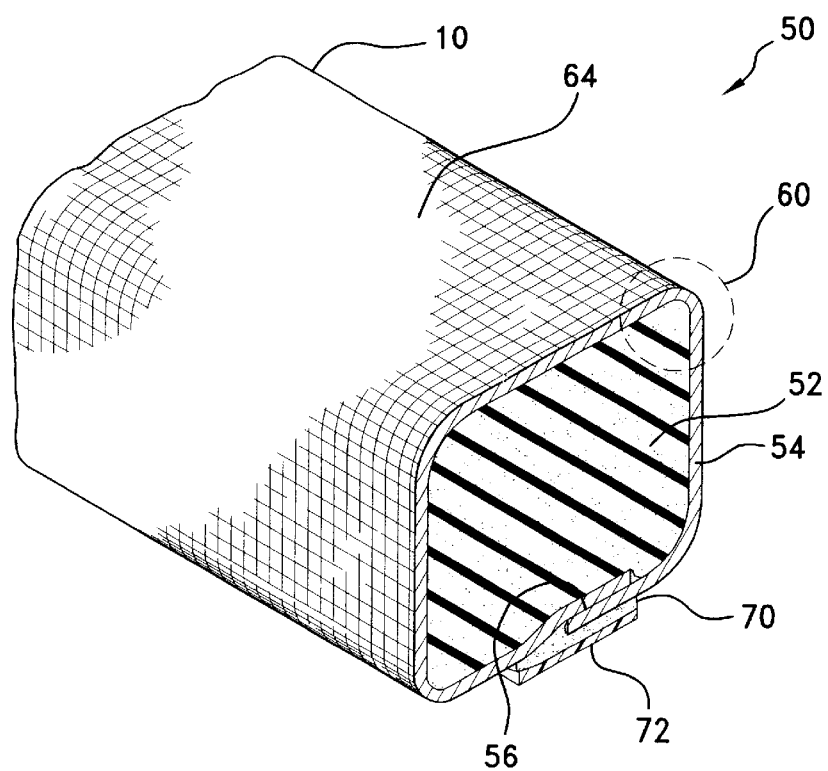
FIG. 4 is a perspective cross-sectional view of a length of a representative EMI shielding gasket construction according to the present invention including a jacket which is formed of the EMI shielding material of FIG. 1.

As aforementioned, EMI shielding material 10 of the present invention is particularly adapted for use as a flame retardant, electrically-conductive jacket which is provided over a foam core in an EMI shielding gasket construction such as gasket 50 of FIG. 4. In a representative embodiment, gasket 50 includes an elongate, resilient foam core member, 52, which may be of an indefinite length. Core member 52 has an outer circumferential surface, 54, defining the cross-sectional profile of gasket 50 which, for illustrative purposes, is of a generally polygonal, i.e., square or rectangular geometry. Other plane profiles, such as circular, semi-circular, or elliptical, or complex profiles may be substituted, however, depending upon the geometry of the interface to be sealed. Core member 12 may be of any radial or diametric extent, but for most applications will have a diametric extent or width of from about 0.25 inch (0.64 cm) to 1 inch (2.54 cm).

For affording gap-filling capabilities, it is preferred that core member 52 is provided to be complaint over a wide range of temperatures, and to exhibit good compression-relaxation hysteresis even after repeated cyclings or long compressive dwells. Core member 52 therefore may be formed of a foamed elastomeric thermoplastic such as a polyethylene, polypropylene, polypropylene-EPDM blend, butadiene, styrene-butadiene, nitride, chlorosulfonate, or a foamed neoprene, urethane, or silicone. Preferred materials of construction include open or closed cell urethanes or blends such as a polyolefin resin/monoolefm copolymer blend, or a neoprene, silicone, or nitrile sponge rubber.

Figure 5:
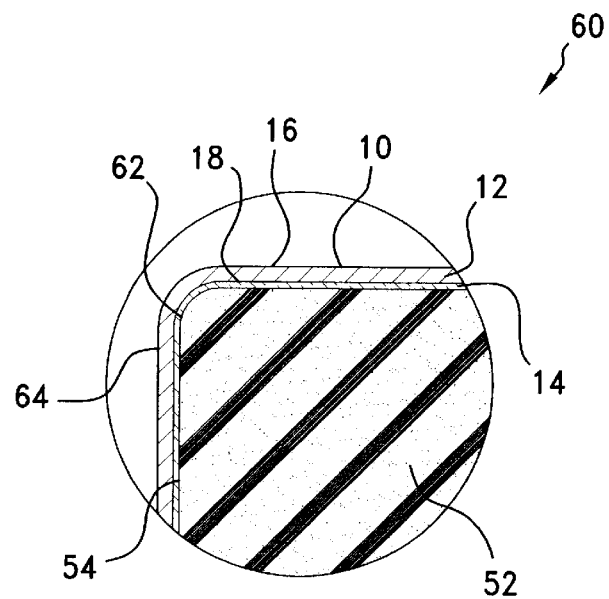
FIG. 5 is an end view of the gasket of FIG. 4 which is magnified to reveal the structure thereof.

Core member 52 may be provided as an extruded or molded foam profile over which shielding material 10 is wrapped as a sheathed, with the edges of sheathed being overlapped as at 56. In a preferred construction, shielding material 10 is bonded to the core member 52 in a continuous molding process wherein the foam is blown or expanded within the shielding material. As may be seen best with reference to the magnified view of FIG. 4 referenced at 60 in FIG. 5, in such construction coating member 14 is disposed adjacent core member 52 as an interior surface, 62, of shielding member 10, with the uncoated side 16 of fabric member 12 being oppositely disposed as an electrically-conductive exterior surface, 64, of the gasket 50. It will be appreciated that the coated interior surface 62 blocks the pores 22 (FIG. 3) of the fabric member 12 of the fabric to retain the blown foam therein without penetrate or bleed through to the exterior gasket surface 64. Depending upon the respective compositions of the foam and coating, the interior surface 62 may function, moreover, as a compatibilizing or "tie" interlayer which promotes the bonding of the foam to the fabric. Gasket construction 50 advantageously provides a structure that may be used in very low closure force, i.e. less than about 1 lb/inch (0.175 N/mm), applications.

Referring again to FIG. 4, an adhesive layer, 70, may be applied along the lengthwise extent of gasket 50 to the underside of exterior surface 64 for the attachment of the gasket to a substrate. Such layer 70 preferably is formulated to be of a pressure sensitive adhesive (PSA) variety. As is described in U.S. Pat. No. 4,988,550, suitable PSA's for EMI shielding applications include formulations based on silicones, neoprene, styrene butadiene copolymers, acrylics, acrylates, polyvinyl ethers, polyvinyl acetate copolyrners, polyisobutylenes, and mixtures, blends, and copolymers thereof. Acrylic-based formulations, however, generally are considered to be preferred for the EMI applications of the type herein involved. Although PSA's are preferred for adhesive layer 70, other adhesives such as epoxies and urethanes may be substituted and, accordingly, are to be considered within the scope of the present invention. Heat-fusible adhesives such a hotmelts and thermoplastic films additionally may find applicability.

Inasmuch as the bulk conductivity of gasket 50 is determined substantially through its surface contact with the substrate, an electrically-conductive PSA may be preferred to ensure optimal EMI shielding performance. Such adhesives conventionally are formulated as containing about 1–25% by weight of a conductive filler to yield a volume resistivity of from about 0.01–0.001 ?-cm. The filler may be incorporated in the form of particles, fibers, flakes, microspheres, or microballoons, and may range in size of from about 1–100 microns. Typically filler materials include inherently conductive material such as metals, carbon, and graphite, or nonconductive materials such as plastic or glass having a plating of a conductive material such as a noble metal or the like. In this regard, the means by which the adhesive is rendered electrically conductive is not considered to be a critical aspect of the present invention, such that any means achieving the desired conductivity and adhesion are to be considered suitable.

For protecting the outer portion of adhesive layer 70 which is exposed on the exterior surface of the gasket, a release sheets, shown at 72, may be provided as removably attached to the exposed adhesive. As is common in the adhesive art, release sheet 72 may be provided as strip of a waxed, siliconized, or other coated paper or plastic sheet or the like having a relatively low surface energy so as to be removable without appreciable lifting of the adhesive from the exterior surface 64.

Figure 6:
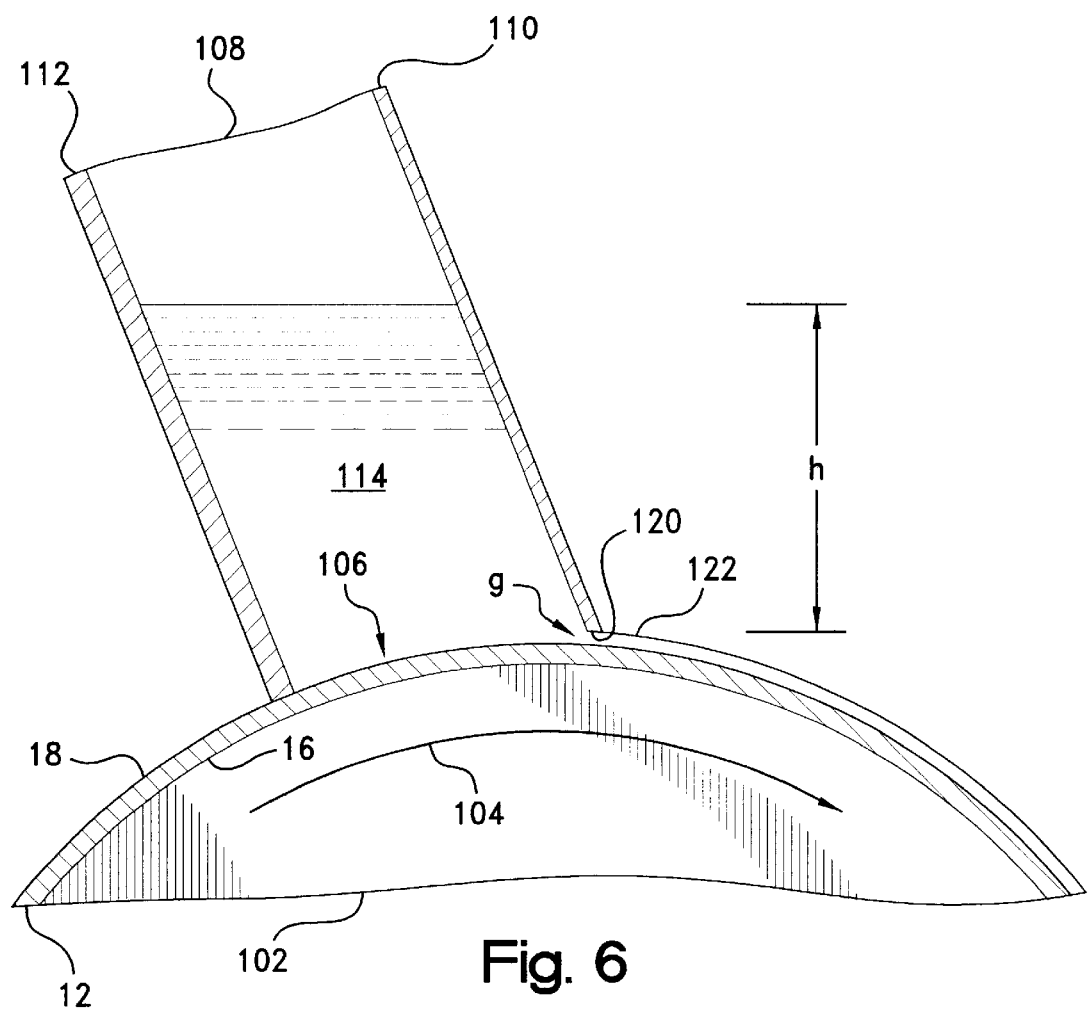
FIG. 6 is a schematic, partially cross-sectional view of an illustrative gravity-fed, knife over roll coater as adapted for use in the manufacture of the EMI shielding material of FIG. 1.

In the production of commercial quantities of the EMI shielding material 10 of the present invention, the viscosity adjusted and otherwise modified acrylic latex emulsion or other resin composition may be coated and cured on one side the fabric member 12 by a direct wet process such as knife over roll or slot die. With whatever process is employed, the hydrodynamic pressure of the resin composition is controlled in accordance with the precepts of the present invention to delimit the penetration of the resin layer to a depth which is less than the thickness dimension of the fabric member. For example, and with reference to FIG. 6 wherein the head of a representative gravity-fed knife over roll coater is shown somewhat schematically at 100, porous, i.e., permeable, fabric member 12 is conveyed from a feed roll or the like (not shown) over a nip roller, 102, which rotates in the direction referenced by arrow 104. With the first side 16 of fabric member 12 supported on roller 102, the fabric second side 18 is passed beneath the opening, referenced at 106, of a coating trough, 108. Trough 108 is defined by a front plate, 110, a back plate, 112, and a pair of side plates (not shown).

The emulsion or other fluent resin composition, referenced at 114, is pumped or otherwise transported into trough 108 which is filled to a fluid level, referenced at h. For a given fluid density, this level h is controlled such that the hydrodynamic pressure at the fabric-liquid interface is maintained within preset limits. For example, with a fluid density of about 10 pounds per gallon (1.8 g/cm$^3$), and a fabric having a porosity of about 1000–2000 openings per inch with a mean average pore size of between about 0.5–2 mils (12.5–50 µm), the fluid level H is controlled at about 4 inches (10 cm) to yield a hydrodynamic pressure of about 0.05 psi (0.35 kPa) at the fabric-liquid interface. For other coating processes, the hydrodynamic fluid pressure may be controlled, for example, by a pumping pressure or the like.

In the illustrative knife-over-roll coating process, the lower edge, 120, of front plate 110 defines a knife surface which is shimmed or otherwise spaced-apart a predetermined distance from the second side 18 of fabric member 12. Such spacing provides a clearance or gap, referenced at "g," of typically about 10 mils (0.25 mm), but which is adjustable to regulate the thickness of the liquid coating layer, 122, being applied to the fabric member. From roller 104, the coated fabric member 12 may be conveyed via a take-up roller arrangement (not shown) through a in-line oven or the like to dry or flash the water or other diluent in the liquid coating layer 122, or to otherwise cure the liquid coating layer 122 in developing an adherent, tack-free, film or other layer of coating member 14 (FIG. 1) on the single side 18 of fabric member 12.

The Example to follow, wherein all percentages and proportions are by weight unless otherwise expressly indicated, is illustrative of the practicing of the invention herein involved, but should not be construed in any limiting sense.

EXAMPLE

Representative EMI shielding materials according to the present invention were constructed for characterization. In this regard, a master batch of a flame retardant coating composition was compounded using an acrylic latex emulsion (Heveatex "4129FR"). The viscosity of the emulsion was adjusted to a Brookfield viscosity (#4 spindle, 40 speed) of about 60,000 cps with about 5 wt % of an acryloid thickener (Acrysol™ GS, Monsanto Co., St. Louis, Mo.). The modified emulsion had a total solids content of about 60% by weight, a density of about 10 pounds per gallon (1.8 g/cm$^3$), and a pH of between about 7.5 and 9.5.

The emulsion was applied using a knife over roll coater (JETZONE Model 7319, Wolverine Corp., Merrimac, Mass.) to one side of a silver-plated nylon fabric (Swift "31EN RIPSTOP") having a thickness of about 4 mils (0.1 mm). With the fluid level in the coating trough of the coater maintained at about 4 inch (10 cm), the emulsion was delivered to the surface of the cloth at a hydrodynamic pressure of about 0.05 psi (0.35 kPa). The coating knife was shimmed to a 10 mil (0.25 mm) gap above the fabric to yield a wet coating draw down thickness of about 10 mils. Following an oven curing at 100–125° C. for 5 minutes, a dried coating or film thickness of about 2.5 mils (0.635 mm) was obtained with a weight pickup of about 130–145 g/yd$^2$ and a total material thickness of between about 6–7 mils (0.15–0.18 mm). An inspection of the coated fabric cloth revealed a coating penetration depth of about 1–2 mils (0.02–0.05 mm) providing acceptable mechanical retention and/or adhesion of the coating onto the fabric surface. The opposite side of the fabric, however, was observed to be substantially coating free, and to retain a surface resistivity of about 0.1 Ω/sq for unaffected EMI shielding effectiveness.

Fabric samples similarly coated in the manner described were subjected to an in-house vertical flame test. No burning was observed at dried film thickness of 2, 3, or 4 mils (0.05, 0.08, 0.10 mm). Accordingly, a reasonable operating window of film thickness was suggested for production runs.

Samples also were provided, as jacketed over a polyurethane foam core in an EMI shielding gasket construction, for flame testing by Underwriters Laboratories, Inc., Melville, New York. A flame class rating of V-0 under UL94 was assigned at a minimum thickness of 1.0 mm. The gasket construction therefore was found to be compliant with the applicable UL requirements, and was approved to bear the "UL" certification mark.

The foregoing results confirm that the EMI shielding material of the present invention affords UL94 V-0 protection when used as a jacketing in a fabric-over-foam gasket construction. Unexpectedly, it was found that a relatively porous or permeable fabric may be wet coated on one side with a relatively thin, i.e., 2–4 mil (0.05–0.10 mm), coating layer of a flame retardant composition without compromising the electrical surface conductivity of the other side. Such a thin coating layer, while being sufficient to provide UL94 V-0 protection in a conventional fabric-over-foam gasket construction, nonetheless maintains the drapability the fabric and thereby facilitates the fabrication of UL94 V-0 compliant gaskets having complex profiles or narrow cross-sections down to about 1 mm.

As it is anticipated that certain changes may be made in the present invention without departing from the precepts herein involved, it is intended that all matter contained in the foregoing description shall be interpreted as illustrative and not in a limiting sense. All references cited herein are expressly incorporated by reference.

What is claimed is:

1. A method of making a flame retardant, electrically-conductive EMI shielding material comprising the steps of:
   (a) providing a generally planar, porous fabric member having at least an electrically-conductive first side and a second side defining a thickness dimension therebetween;
   (b) applying a curable layer of a fluent, flame retardant composition under a hydrodynamic pressure and viscosity to at least a portion of the second side of said fabric member;
   (c) controlling said hydrodynamic pressure and viscosity of said composition to delimit the penetration of said layer into said fabric member to a depth which is less than the thickness dimension of said fabric member; and
   (d) curing said layer to form a flame retardant coating member on the second side of said fabric member whereby the first side of said fabric member remains electrically-conductive.

2. The method of claim 1 wherein said flame retardant composition of step (b) comprises a flame retardant acrylic latex emulsion.

3. The method of claim 1 wherein the viscosity of said composition is controlled in step (c) to between about 40,000–60,000 centipoise.

4. The method of claim 1 wherein the hydrodynamic pressure of said composition is controlled in step (c) at about 0.05 psi (0.35 kPa).

5. The method of claim 1 wherein said layer is cured in step (d) to a coating thickness of between about 2–4 mils (0.05–0.10 mm).

6. The method of claim 1 wherein the thickness dimension of said fabric member of step (a) is between about 2–4 mils (0.05–0.10 mm).

7. The method of claim 6 wherein said fabric member is provided in step (a) as a metal-plated, woven cloth having an mean average pore size of between about 0.5–2 mils (12.5–50 $\mu$m).

8. The method of claim 7 wherein said cloth is woven of fibers selected front the group consisting of cotton, wool, silk, cellulose, polyester, polyamide, nylon, and combinations thereof, and is plated with a metal selected from the group consisting of copper, nickel, silver, nickel-plated-silver, aluminum, tin, and combinations thereof.

9. The method of claim 8 wherein said fibers have a diameter of between about 10–50 $\mu$m.

* * * * *